United States Patent [19]

DeFreeze et al.

[11] Patent Number: 4,797,892
[45] Date of Patent: Jan. 10, 1989

[54] LONGITUDINALLY COUPLED SURFACE EMITTING SEMICONDUCTOR LASER ARRAY

[75] Inventors: Richard K. DeFreeze, Hillsboro; Richard A. Elliott; Joseph Puretz, both of Beaverton, all of Oreg.

[73] Assignee: Oregon Graduate Center, Beaverton, Oreg.

[21] Appl. No.: 48,544

[22] Filed: May 11, 1987

[51] Int. Cl.$^4$ ................................................ H01S 3/19
[52] U.S. Cl. ........................................ 372/50; 372/23; 372/97; 372/48; 372/108
[58] Field of Search ................................ 372/50, 48, 108; 357/17; 11/23, 97

[56] References Cited

U.S. PATENT DOCUMENTS 4,633,476 12/1986 Scifres et al. ........................ 372/50

OTHER PUBLICATIONS

Chow, "Two-Dimensional Phase-Locked Laser Array," National Technical Information Service (U.S. Dept. of Comm.), publication date unknown.
Evans, et al., "Surface-Emitting Second Order Distributed Bragg Reflector Laser with Dynamic Wavelength Stabilization and Far-Field Angle of 0.25°," Applied Physics Letters, vol. 49, No. 6, Aug. 11, 1986, pp. 314–315.
Yang, et al., "Surface-Emitting GaAlAs/GaAs Linear Laser Arrays with Etched Mirrors," Applied Physics Letters, vol. 49, No. 18, Nov. 3, 1986, pp. 1138–1139.
(Anonymous), "RCA Laboratories Develops Surface-Emitting Diode Laser," Lasers & Applications, vol. 5, No. 11, Nov. 1986, pp. 18, 20.

Primary Examiner—William L. Sikes
Assistant Examiner—Georgia Y. Epps
Attorney, Agent, or Firm—Kolisch, Hartwell & Dickinson

[57] ABSTRACT

A longitudinally coupled, coherent, surface emitting semiconductor laser array in a monolithic wafer is disclosed. Active regions of diode laser-striped semiconductor material are focused ion beam (FIB) micromachined to form transversely disposed channels of symmetric, opposed, generally parabolic mirrored surfaces. Diode laser pairs, emitting laser energy in a generally horizontal plane, are longitudinally injection-coupled (phase-locked) by semi-transmissive, opposed regions that are micromachined into the otherwise reflective parabolic surfaces of the channel. Coherent, laser energy is reflected thereby generally normally away from the surface of the monolithic structure.

5 Claims, 1 Drawing Sheet

LONGITUDINALLY COUPLED SURFACE EMITTING SEMICONDUCTOR LASER ARRAY

BACKGROUND AND SUMMARY OF THE INVENTION

This invention relates generally to coherent, surface emitting, semiconductor laser arrays. More particularly, the invention relates to the fabrication of longitudinally coupled, surface emitting semiconductor laser pairs in a monolithic wafer.

The pote tial for monolithic integration of semiconductor diode lasers and other optical and electronic devices has stimulated the investigation of various means of forming diode lasers that emit light normal to the plane of the wafer. Two general types of such lasers, termed surface emitting lasers, are known to have been constructed. One has a short oscillator cavity oriented perpendicular to the plane of the wafer and the other has its cavity oriented in the plane of the wafer with emission normal to the surface being accomplished by either a turning mirror or a distributed Bragg reflector fabricated in the surface of the wafer. Further, investigation of means of forming diode lasers which are simultaneously surface emitting and longitudinally coupled has been stimulated by the potential of coupling several monolithically formed diode lasers together to enable tuning all to a single wavelength, and to promote phase-locking for coherent emission. A structure to accomplish longitudinal coupling and surface emission is proposed by the present invention.

Turning mirrors have been successfully fabricated in the surface of semiconductor materials, e.g., GaAs, AlGaAs, by chemical etching, mass transport, ion-milling, and ion-beam assisted etching. Focused ion beam (FIB) micromachining of integrated optical structures including turning mirrors has recently been reported. The FIB micromachining of high-quality optical surfaces to create low threshold diode lasers, coupled-cavity lasers and surface emitting diode lasers is described in our copending application Ser. No. 858,357, entitled "Focused Ion Beam Micromachining of Optical Surfaces in Materials", filed May 1, 1986, and now U.S. Pat. No. 4,698,129 and in our published reports entitled "Focused-Ion Beam Micromachined AlGaAs Semiconductor Laser Mirrors," *Electronics Letters*, Vol. 22, No. 13, pp. 700–702 (1986), and "300 mW Operation of a Surface Emitting Phase-Locked Array of Diode Lasers," Electronics Letters, Vol. 23, No. 3, pp. 130–131 (1987), all of which are incorporated herein by this reference.

Optical-quality FIB micromachining makes possible the preparation of intricately curved semiconductor laser surfaces, such as parabolic turning mirrors, as well as other structures required for wafer scale monolithic integration. One such structure, found to have particularly useful surface emitting and injection-coupling features, is proposed by the present invention.

Diode lasers are typically manufactured from a wafer consisting of, for example, a GaAs substrate on which layers of AlGaAs and GaAs have been grown epitaxially to form a p-n junction and an optical wave guide. The wave guide serves to confine the radiation emitted by recombining electrons and holes at the p-n junction to a thin layer in the plane of the wafer. Long narrow laser cavities, e.g., $1 \times 4 \times 300$ $\mu$m, are formed by restricting the light laterally by either a lateral wave guide, in the case of index-guided lasers, or by confining the current carriers laterally, in the case of gain-guided lasers. The laser oscillator mirrors which define the longitudinal dimension of a laser are conventionally formed by cleaving the wafer crystal perpendicular to the laterally confining feature, be it an optical wave guide or high current, high gain stripe.

By micromachining a vertical output mirror and a 45° planar turning mirror perpendicular to a high-gain stripe, the laser energy which would otherwise be emitted in the plane of the substrate and in the direction of the stripe (longitudinal) may be reflected in a direction generally normal to the surface of the wafer.

Planar mirrors are not an ideal geometry for reflecting laser energy normal to the surface. This is because photon emission from the vertically micromachined emitting region within the monolithic structure is not planar, but rather is strongly divergent. A parabolic, mirrored surface located at twice the parabola's focal length from an emitting region will ideally redirect all incident laser energy normally away from the surface in a diffraction-limited beam. If channels having symmetric, thus-located parabolic sections are micromachined into the surface of the diode laser wafer perpendicular to the stripe thereof, then laser energy from adjacent emitting regions incident upon either parabolic surface will be reflected normal to the surface of the array. By injecting laser energy from an emitting region on one side of the channel to the emitting region on the other side of the channel, the stripes that are interrupted by the channels may be longitudinally injection coupled to one another.

Accordingly, it is an object of this invention to provide a coherent, longitudinally coupled surface emitting semiconductor laser array in a monolithic substrate.

Another object is to provide such an array that is compatible with known micromachining processes.

Yet another object of the present invention is to provide a laser array that makes use of conventional diode laser materials.

In the preferred embodiment of the present invention, FIB micromachining enables the preparation of such channels in the surface of diode laser wafer material to produce a coherent, surface emitting semiconductor laser array in a monolithic structure having a plurality of longitudinally injection-coupled lasers therein. The surface emitting and injection coupling geometries are well defined, and highly controlled by the FIB micromachining process. The injection coupling of adjacent emitting regions is accomplished by insubstantially interrupting the reflective, parabolic surfaces with dual channel-lengthwise, semi-transmissive regions located opposite dual emitting regions. These opposing, injection coupling surfaces act as conduits for laser energy to pass through, thus longitudinally coupling adjacent columns, while insubstantially interrupting the reflective, parabolic surfaces that give rise to surface-normal emission.

These and other objects and advantages of the present invention will be more clearly understood from a consideration of the drawings and the following description of the preferred embodiment.

DETAILED DESCRIPTION OF THE PREFERRED EMBODIMENT

Figure 1:
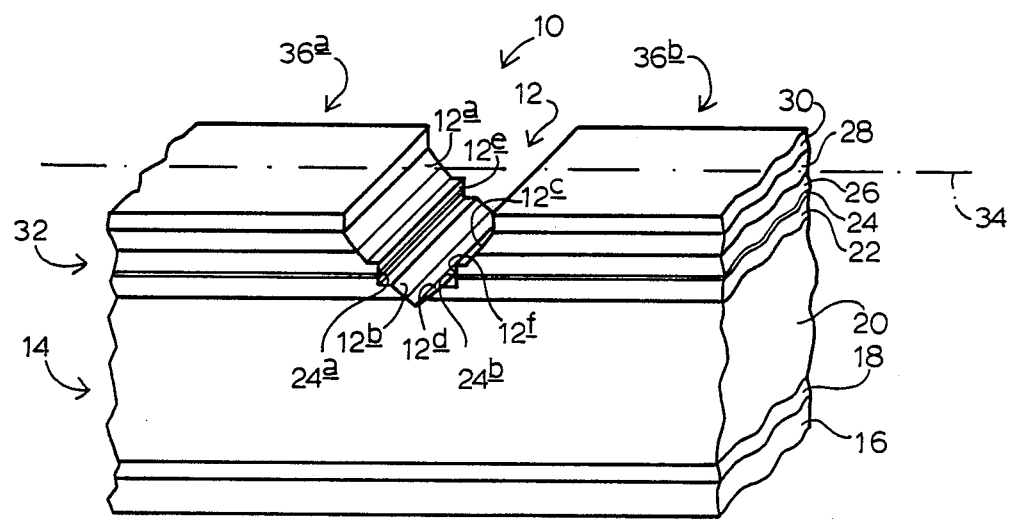
FIG. 1 shows, in fragmentary perspective view, a longitudinally coupled diode laser pair fabricated in accordance with the preferred embodiment of the invention.

Referring first to FIG. 1, a semiconductor diode laser pair, fabricated in accordance with the preferred embodiment of the invention, is indicated generally at 10. Laser pair 10 is fabricated by micromachining a channel 12 into commercially available laser material 14. Material 14 comprises various layers: a bottom layer of heat sink material 16; common electrode 18; (N)-type, preferably GaAs, substrate 20; first cladding layer 22 of (N)-type material, such as AlGaAs; an undoped GaAs layer defining an active region 24; a second cladding layer 26 of (P)-type material, such as AlGaAs; a top semiconductor layer 28, preferably of GaAs; and a top electrode 30. Layers 22, 24, 26, 28, 30 are collectively referred to as monolithic surface 32 of material 14. It is generally within this surface that channel 12 is formed by FIB micromachining. The generally planar interface within material 14 between layers 28, 30 is referred to herein as an emission surface.

Channel 12 is oriented generally perpendicular to longitudinal axis 34, and the formation thereof in surface 32 forms a pair of adjacent, spaced laser means 36a, 36b. Active region 24 is, by the preparation of channel 12, divided into two regions 24a, 24b, each capable of emitting laser energy generally along axis 34 and generally toward one another. This important feature, and the geometry and dimension of channel 12, give rise to longitudinal coupling between laser means 36a, 36b while permitting reflection of some of the laser energy incident upon channel 12 in a direction perpendicular to surface 32. Optical-quality surfaces 12a, 12b, 12c, 12d, are in the cross-sectional shape of parabolic arcs, as will be described in more detail in reference to FIG. 2. These optical quality surfaces enable high-efficiency reflection of incident laser energy therefrom. Optical-quality surfaces 12e, 12f, located adjacent active regions 24a, 24b, represent, in the preferred embodiment, approximately twenty percent of the total surface area of channel 12, insubstantially interrupting the reflective surfaces therein.

Figure 2:
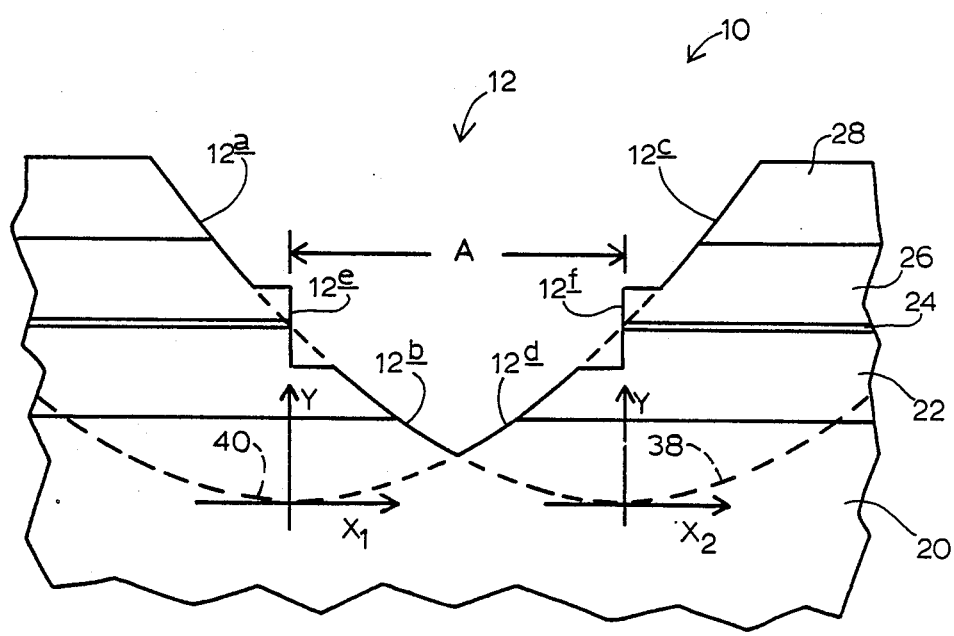
FIG. 2 shows, in schematic form, the detailed cross-sectional geometry of the preferred embodiment.

Turning now to FIG. 2, the detailed cross-sectional geometry of channel 12 is illustrated. Omitted from this fragmentary view, for the sake of clarity, is upper electrode 30. Surfaces 12a, 12b are seen to represent arcs of a parabola 38 described by the equation $y = x_2^2/4f$, where y represents the ordinate, $x_2$ represents the abscissa and f represents the focal length of parabola 38. Complementarily, surfaces 12c, 12d represent arcs of a parabola 40 described by the equation $y = x_1^2/4f$, where y represents the ordinate, $x_1$ represents the abscissa and f represents the focal length of parabola 40. Thus, channel 12 will be seen as having a uniform cross section that may be described as the obtuse intersection of two concavely confronting parabolic arcs.

Importantly, the origins of the Cartesian coordinate systems represented by $(x_1, y)$ and $(x_2, y)$ are separated by distance A of twice the parabolas' focal length f. This relationship results in the placement of transmissive regions 12e, 12f at the focal point of opposite mirrored surfaces, each of which describes a parabola. In other words, surfaces 12a, 12b generally describe a parabola whose focal point is the center of transmissive region 12f; and surfaces 12c, 12d generally describe a parabola whose focal point is the center of transmissive region 12e. It will be appreciated by those skilled in the art that this novel structure ensures nearly ideal reflection from parabolic surfaces 12a, 12b; and 12c, 12d of incident laser energy exiting active regions 12f and 12e, respectively, in a direction normal to the plane of active region 24. In cooperation with active region 24, semi-transmissive regions 12e, 12f act as what may be thought of as an injection conduit, enabling the injection coupling of laser means 36a, 36b (refer to FIG. 1). Transmissive regions 12e, 12f are, in the preferred embodiment, generally parallel planar with one another, and are, in cross section, generally coaxial with the generally parallel, surface-normal axes of parabolas 40, 38. In the preferred embodiment, regions 12e, 12f are located, relative to the emission surface, at approximately one-half the depth of channel 12.

The advantages offered by the invention should be apparent to those skilled in the art. The novel structure disclosed herein enables efficient, longitudinal, injection coupling of laser energy between adjacent, horizontally emitting active regions of, and surface-normal emission of laser energy away from, a monolithic structure. It will be appreciated that multiple channels may be formed, in accordance with the invention, across a stripe of diode laser material to produce high-power, coherent, linear arrays of semiconductor diode lasers.

Accordingly, while a preferred embodiment of the invention has been described herein, it is appreciated that further modifications are possible that come within the scope of the invention.

It is claimed and desired to secure by Letters Patent:

1. A coherent, surface emitting, semiconductor laser array in a monolithic wafer having an emission surface comprising:
   at least one pair of adjacent, spaced semiconductor lasers, each laser including plural semiconductor layers which form an oscillator cavity generally in the plane of said wafer and each laser including electrode means for energizing said cavity to emit energy of a predefined wavelength from said cavity;
   means for phase locking said pair; and
   means for reflecting a portion of said energy generally normal to and away from said surface.

2. The array of claim 1, wherein said reflecting means comprises a channel recessed into said surface and transversely interposing said pair to space said lasers, said channel having a surface-defined uniform cross section generally conforming to the obtuse intersection of two concavely confronting parabolic arcs of equal focal length having their axes normal to said surface, with the surface which defines said cross section being substantially reflective of such emitted energy.

3. The array of claim 2, wherein said phase locking means comprises dual, facing, generally parallel-planar transmission regions within said channel, said transmission regions being located generally at the focal points of said parabolic arcs, said regions insubstantially interrupting the parabolic curvature of said cross section to permit injection-coupled phase locking of said pair of lasers.

4. The array of claim 3, wherein said regions are located generally at one-half the depth of said channel as measured from said emission surface.

5. The array of claim 3, wherein said channel is dimensioned to separate said regions generally by twice said focal length.

* * * * *

UNITED STATES PATENT AND TRADEMARK OFFICE
CERTIFICATE OF CORRECTION

PATENT NO. : 4,797,892
DATED : January 10, 1989
INVENTOR(S) : Richard K. DeFreez, Richard A. Elliott and Joseph Puretz It is certified that error appears in the above-identified patent and that said Letters Patent is hereby corrected as shown below:

On Cover Page:

In the Heading: change "DeFreeze et al." to --DeFreez et al.--

Inventors: change "Richard K. DeFreeze," to --Richard K. DeFreez,--

In the Specification:

Column 3, line 53, change "$y=x_1 2/4f$" to --$y=x_1^2/4f$--.

Signed and Sealed this

Twenty-second Day of August, 1989

Attest:

DONALD J. QUIGG

*Attesting Officer*  *Commissioner of Patents and Trademarks*